United States Patent
Takita

(10) Patent No.: US 12,527,108 B2
(45) Date of Patent: Jan. 13, 2026

(54) MANUFACTURING METHOD OF PHOTOELECTRIC CONVERSION PANEL, MANUFACTURING METHOD OF X-RAY IMAGING PANEL, AND PHOTOELECTRIC CONVERSION PANEL

(71) Applicant: Sharp Display Technology Corporation, Kameyama (JP)

(72) Inventor: Rikiya Takita, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 203 days.

(21) Appl. No.: 18/237,153

(22) Filed: Aug. 23, 2023

(65) Prior Publication Data
US 2024/0128298 A1 Apr. 18, 2024

(30) Foreign Application Priority Data
Oct. 13, 2022 (JP) .................................. 2022-165033

(51) Int. Cl.
| | |
|---|---|
| H01L 27/146 | (2006.01) |
| G01T 1/20 | (2006.01) |
| H10F 39/00 | (2025.01) |
| H10F 39/18 | (2025.01) |

(52) U.S. Cl.
CPC .......... H10F 39/811 (2025.01); G01T 1/2018 (2013.01); H10F 39/014 (2025.01); H10F 39/1898 (2025.01)

(58) Field of Classification Search
None
See application file for complete search history.

(56) References Cited

U.S. PATENT DOCUMENTS

| | | | | |
|---|---|---|---|---|
| 2012/0056252 | A1* | 3/2012 | Aoki | H10F 39/813 |
| | | | | 257/292 |
| 2012/0074329 | A1* | 3/2012 | Granfors | H10F 39/189 |
| | | | | 250/370.09 |
| 2014/0027828 | A1* | 1/2014 | Kim | H10F 39/8057 |
| | | | | 257/292 |
| 2016/0091616 | A1* | 3/2016 | Homma | G01T 1/20189 |
| | | | | 29/829 |
| 2022/0390623 | A1* | 12/2022 | Shang | G01N 23/04 |

FOREIGN PATENT DOCUMENTS

JP  H0799344 A  4/1995

* cited by examiner

*Primary Examiner* — Marcus H Taningco
(74) *Attorney, Agent, or Firm* — ScienBiziP, P.C.

(57) ABSTRACT

Provided is a manufacturing method of a photoelectric conversion panel including forming a photodiode in a frame region, forming a first wiring line overlapping a first portion in a plan view, the first wiring line connecting a TFT or a photodiode and the photodiode, forming a second wiring line not overlapping the first portion in a plan view and overlapping a second portion in the plan view, and forming a third portion between the first portion and the second portion. The third portion is a portion not overlapping the first wiring line and the second wiring line in a plan view. Thereafter, the manufacturing method of a photoelectric conversion panel includes dividing the photodiode and the substrate at the third portion.

7 Claims, 13 Drawing Sheets

MANUFACTURING METHOD OF PHOTOELECTRIC CONVERSION PANEL, MANUFACTURING METHOD OF X-RAY IMAGING PANEL, AND PHOTOELECTRIC CONVERSION PANEL

CROSS-REFERENCE TO RELATED APPLICATIONS

This application claims the benefit of priority to Japanese Patent Application Number 2022-165033 filed on Oct. 13, 2022. The entire contents of the above-identified application are hereby incorporated by reference.

BACKGROUND

Technical Field

The disclosure relates to a manufacturing method of a photoelectric conversion panel, a manufacturing method of an X-ray imaging panel, and a photoelectric conversion panel.

The manufacturing method of a semiconductor light-emitting device described in JP H7-99344 includes dividing a substrate along a cutting line. The manufacturing method includes forming a plurality of electrodes on the substrate, and, before dividing the substrate, forming a short circuit wiring line connected to all of the plurality of electrodes on the substrate straddling the cutting line. The short circuit wiring line is formed of a thin film made of metal.

SUMMARY

In the semiconductor light-emitting device described in JP H7-99344, after the substrate is divided along the cutting line, the short circuit wiring line formed of a thin film made of metal is exposed at the outer end surface of the substrate. This state makes the exposed short circuit wiring line susceptible to static electricity from outside of the substrate. This causes the problem of the semiconductor light-emitting device being susceptible to Electro Static Discharge (ESD) from an element on the substrate after the substrate is divided.

Thus, the disclosure has been made to solve the above-described problems, and an object of the disclosure is to provide a manufacturing method of a photoelectric conversion panel resistant to static electricity after division of a substrate, a manufacturing method of an X-ray imaging panel, and a photoelectric conversion panel.

To solve the above-described problems, a manufacturing method of a photoelectric conversion panel according to a first aspect of the disclosure includes: forming a transistor in a pixel region above a substrate; forming a first photodiode connected to the transistor in the pixel region; forming a second photodiode in a region outside the pixel region; forming a first wiring line overlapping a first portion of the second photodiode in a plan view, the first wiring line connecting the transistor or the first photodiode and the second photodiode; forming a second wiring line not overlapping the first portion of the second photodiode in a plan view and overlapping a second portion of the second photodiode in a plan view; and dividing the second photodiode and the substrate at a third portion between the first portion of the second photodiode and the second portion of the second photodiode, the third portion not overlapping the first wiring line and the second wiring line in a plan view.

A manufacturing method of an X-ray imaging panel according to a second aspect includes: forming a transistor in a pixel region above a substrate; forming a first photodiode connected to the transistor in the pixel region; forming a second photodiode in a region outside the pixel region; forming a first wiring line overlapping a first portion of the second photodiode in a plan view, the first wiring line connecting the transistor or the first photodiode and the second photodiode; forming a second wiring line not overlapping the first portion of the second photodiode in a plan view and overlapping a second portion of the second photodiode in a plan view; forming a scintillator covering the pixel region; and dividing the second photodiode and the substrate at a third portion between the first portion of the second photodiode and the second portion of the second photodiode, the third portion not overlapping the first wiring line and the second wiring line in a plan view.

A photoelectric conversion panel according to a third aspect includes: a substrate; a transistor formed in a pixel region above the substrate; a photodiode formed in the pixel region, the photodiode being connected to the transistor; a semiconductor layer formed in a region outside the pixel region, the semiconductor layer being formed in an identical layer to a layer including the photodiode; and a first wiring line overlapping a first portion of the semiconductor layer in a plan view, the first wiring line connecting the transistor or the photodiode and the semiconductor layer, wherein a portion of the semiconductor layer not overlapping the first wiring line in a plan view is exposed at an end surface of the substrate.

According to the above-described manufacturing method, the first wiring line and the second wiring line are not exposed at the cutting surface of the photoelectric conversion panel or the X-ray imaging panel. As a result, a photoelectric conversion panel and an X-ray imaging panel resistant to static electricity from the cutting surface even after the substrate is divided can be manufactured. Also, according to the above-described configurations, the first wiring line is not exposed at the cutting surface (end surface) of the photoelectric conversion panel (substrate). Accordingly, a photoelectric conversion panel resistant to static electricity from the cutting surface can be configured.

BRIEF DESCRIPTION OF DRAWINGS

The disclosure will be described with reference to the accompanying drawings, wherein like numbers reference like elements.

DESCRIPTION OF EMBODIMENTS

Figure 1:
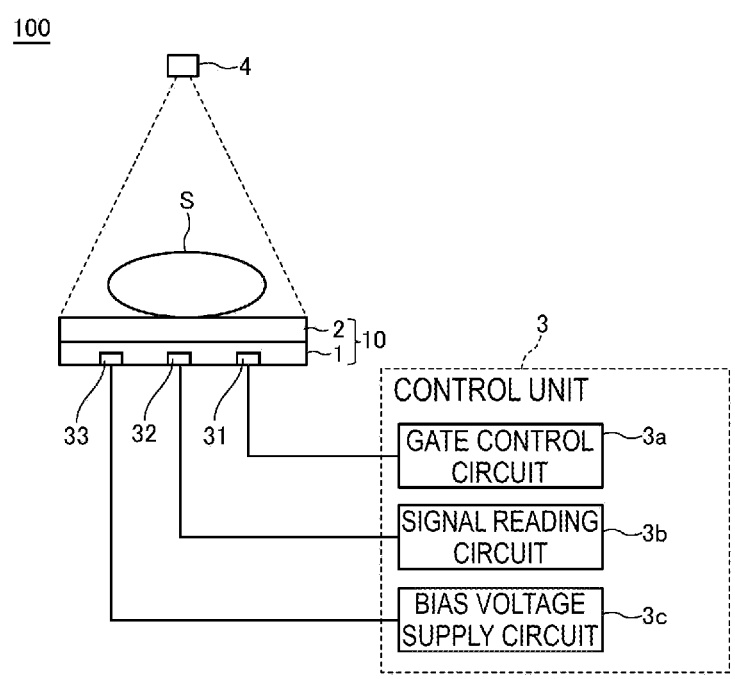
FIG. 1 is a schematic view illustrating an X-ray imaging device 100 provided with an X-ray imaging panel 10 including a photoelectric conversion panel 1.

Embodiments of the disclosure will be described below with reference to the drawings. Note that the disclosure is not limited to the following embodiments, and appropriate design changes can be made within a scope that satisfies the configuration of the disclosure. In the description below, the same reference signs are used in common among the different drawings for portions having the same or similar functions, and repeated description thereof will be omitted. Further, the configurations described in the embodiments and the modified examples may be combined or modified as appropriate within a range that does not depart from the gist of the disclosure. For ease of explanation, in the drawings referenced below, the configuration is simplified or schematically illustrated, or a portion of the components is omitted. Further, dimensional ratios between components illustrated in the drawings are not necessarily indicative of actual dimensional ratios.

Configuration of X-Ray Imaging Device 100

FIG. 1 is a schematic view illustrating an X-ray imaging device 100 provided with an X-ray imaging panel 10 including a photoelectric conversion panel 1 according to the present embodiment. The X-ray imaging device 100 is provided with the X-ray imaging panel 10 including the photoelectric conversion panel 1 and a scintillator 2, a control unit 3, and an X-ray source 4.

As illustrated in FIG. 1, the control unit 3 includes a gate control circuit 3a, a signal reading circuit 3b, and a bias voltage supply circuit 3c. The gate control circuit 3a is connected to a gate terminal 31 of the photoelectric conversion panel 1. The signal reading circuit 3b is connected to a data terminal 32. The bias voltage supply circuit 3c is connected to a bias terminal 33.

The X-ray source 4 irradiates a subject S with X-rays. X-rays passing through the subject S are converted into fluorescence (hereinafter, referred to as "scintillation light") in the scintillator 2 disposed at an upper portion of the photoelectric conversion panel 1. The X-ray imaging device 100 generates an X-ray image by imaging the scintillation light with the X-ray imaging panel 10.

Figure 2:
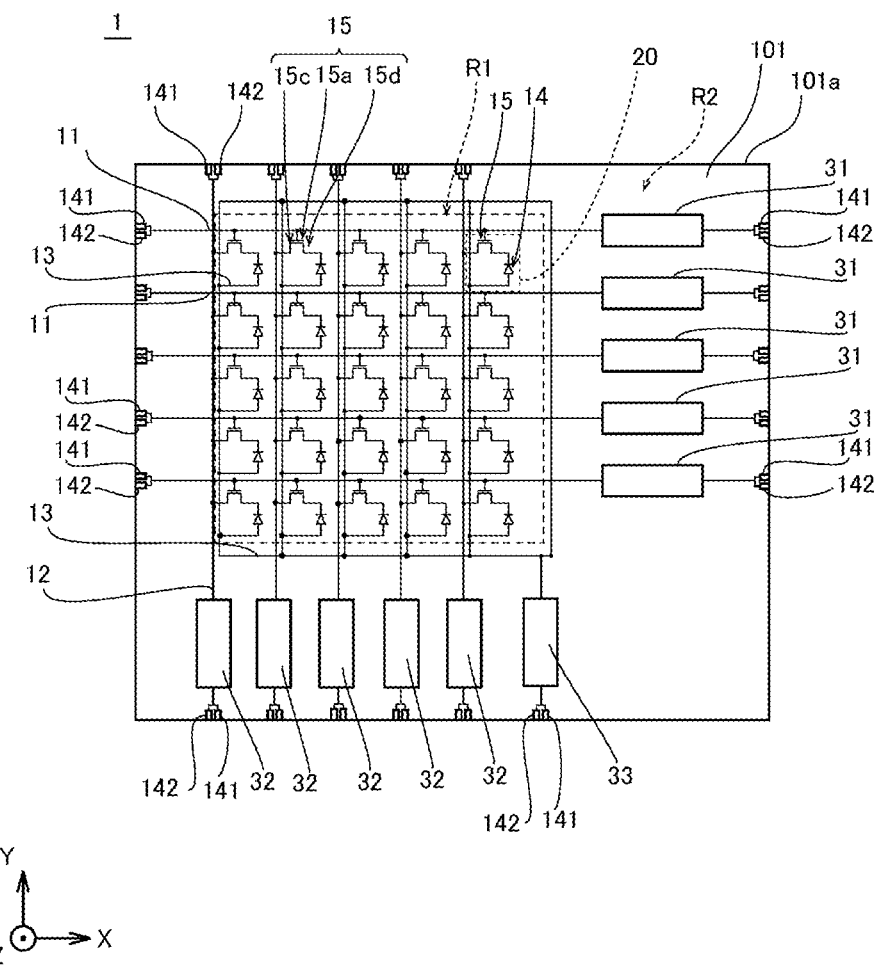
FIG. 2 is a schematic plan view illustrating a schematic configuration of the photoelectric conversion panel 1.

FIG. 2 is a schematic view illustrating a schematic configuration of the photoelectric conversion panel 1. A plurality of the gate terminals 31, a plurality of the data terminals 32, the bias terminal 33, a plurality of photodiodes 14, and a plurality of thin film transistors (TFTs) 15 are formed on a substrate 101 of the photoelectric conversion panel 1. A plurality of gate lines 11, a plurality of data lines 12, and a bias line 13 are formed on the substrate 101 of the photoelectric conversion panel 1. A plurality of photodiodes 141 and 142 are disposed at each one of four end surfaces 101a of the substrate 101 having a rectangular shape. In other words, the post-division plurality of photodiodes 141 and plurality of photodiodes 142 are exposed at the end surfaces 101a of the substrate 101. The plurality of photodiodes 141 and 142 are each electrically connected to the plurality of gate lines 11, the plurality of data lines 12, or the bias line 13. In other words, the plurality of photodiodes 141 and 142 are connected to the photodiodes 14 or the TFTs 15 via the gate lines 11, the data lines 12, and the bias line 13.

The plurality of gate lines 11 connect gate electrodes 15a of the TFTs 15 and the gate terminals 31. The plurality of data lines 12 connect source electrodes 15c of the TFTs 15 and the data terminals 32. The bias line 13 connects the photodiodes 14 and the bias terminal 33.

As illustrated in FIG. 2, the photoelectric conversion panel 1 is provided with a pixel region R1 (active region) and a frame region R2. The pixel region R1 has, for example, a rectangular shape in a plan view. The pixel region R1 is a region in which a plurality of pixels 20 are formed. The pixels 20 are the regions defined by the gate lines 11 and the data lines 12. The frame region R2 is provided outside the pixel region R1. In the frame region R2, the gate terminals 31, the data terminals 32, the bias terminal 33, and the photodiodes 141 and 142 are disposed.

As illustrated in FIG. 2, in the pixel region R1, the plurality of gate lines 11 and the plurality of data lines 12 are formed intersecting one another. Thus, the plurality of pixels 20 are formed in a matrix in a plan view. The photoelectric conversion panel 1 includes an active matrix substrate. The bias line 13 is formed, for example, along the data line 12. Each of the pixels 20 is provided with the photodiode 14 and the TFT 15.

As illustrated in FIG. 2, in the frame region R2, the plurality of gate terminals 31 are disposed side by side in the Y direction. Also, in the frame region R2, the plurality of data terminals 32 and the bias terminal 33 are disposed side by side in the X direction. The plurality of gate terminals 31 transmits gate signals from the gate control circuit 3a to the gate lines 11. The plurality of data terminals 32 apply a reading voltage from the signal reading circuit 3b to the data lines 12. The plurality of data terminals 32 acquire data signals from the photodiodes 14 via the data lines 12 and the TFTs 15 and transmit the data signals to the signal reading circuit 3b. The bias terminal 33 supplies a bias voltage from the bias voltage supply circuit 3c to the bias line 13.

The control unit 3 illustrated in FIG. 1 generates an X-ray image on the basis of data signals obtained by the signal reading circuit 3b when X-rays are emitted from the X-ray source 4. The photodiodes 14 convert the scintillation light into a charge based on the amount of scintillation light obtained by the scintillator converting the X-rays that pass through the subject S when a bias voltage is applied from the bias line 13 and transmit the signals (data signals) corresponding to the charge to the TFTs 15. Then, the control unit 3 causes gate signals to be sequentially and selectively supplied from the gate control circuit 3a to the gate lines 11. The TFTs 15 that are supplied with a gate signal are put in an on. When a reading voltage is applied to the data line 12 via the signal reading circuit 3b and the TFT 15 is put in the on state, a signal (data signal) corresponding to the charge converted at the photodiode 14 is applied to the reading voltage. Then, the signal reading circuit 3b obtains a data signal. The control unit 3 generates an X-ray image on the basis of the data signals of each pixel 20 in the pixel region R1.

Detailed Configuration of Photoelectric Conversion Panel 1

Figure 3:
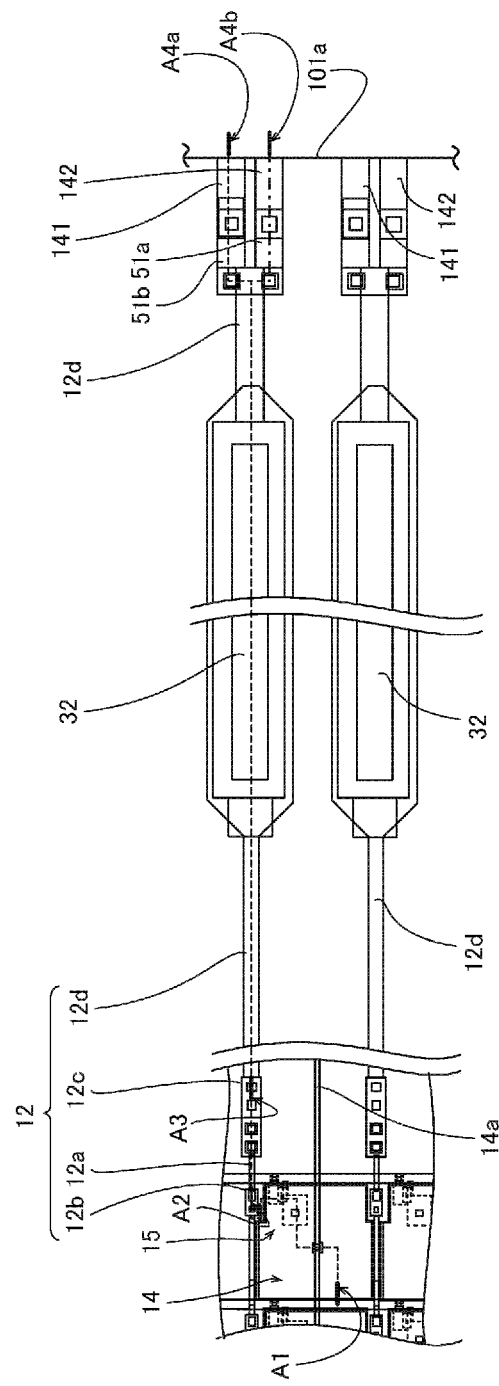
FIG. 3 is a plan view illustrating the configuration of a part of the photoelectric conversion panel 1.
Figure 4:
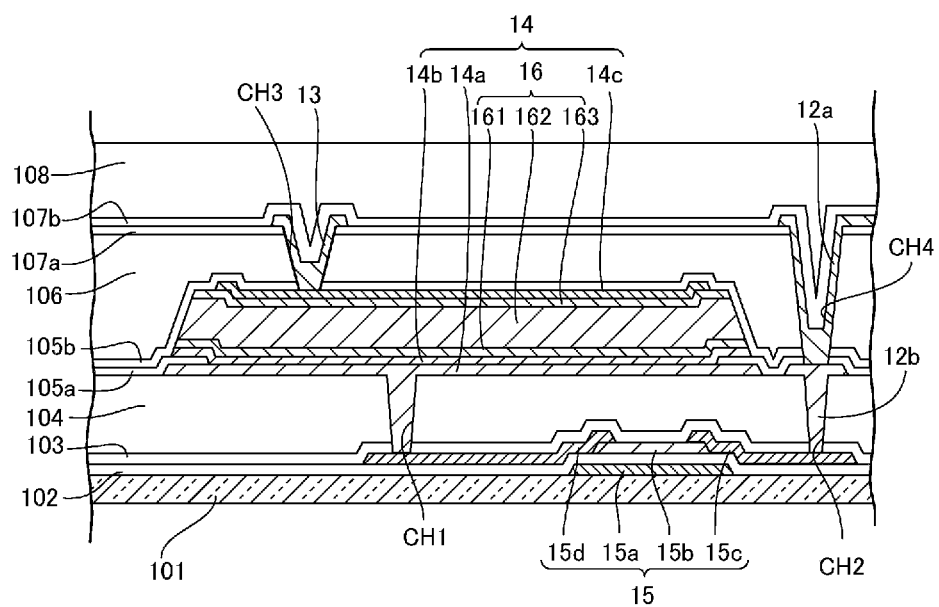
FIG. 4 is a cross-sectional view of the photoelectric conversion panel 1 taken along line A1-A2 in FIG. 3.
Figure 5:
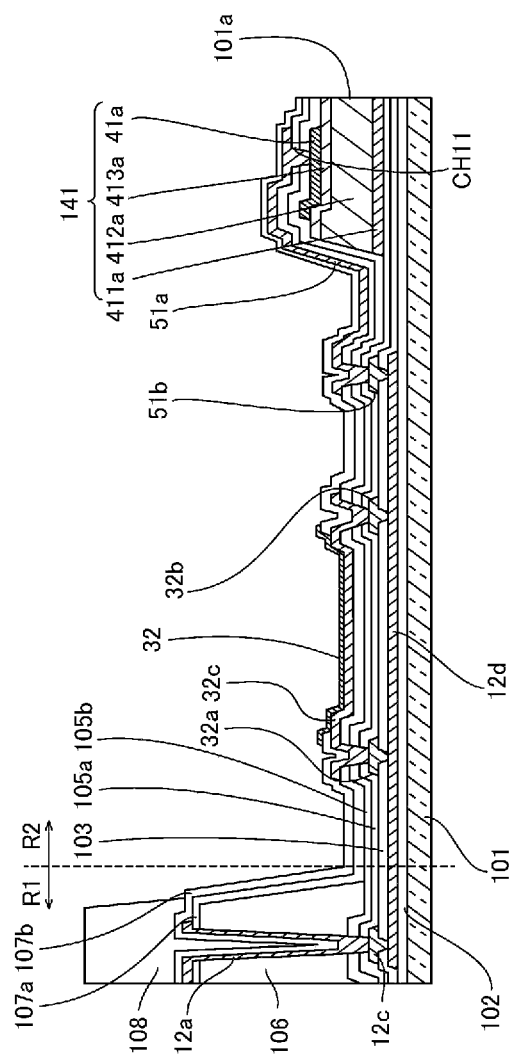
FIG. 5 is a cross-sectional view of the photoelectric conversion panel 1 taken along line A3-A4a in FIG. 3.
Figure 6:
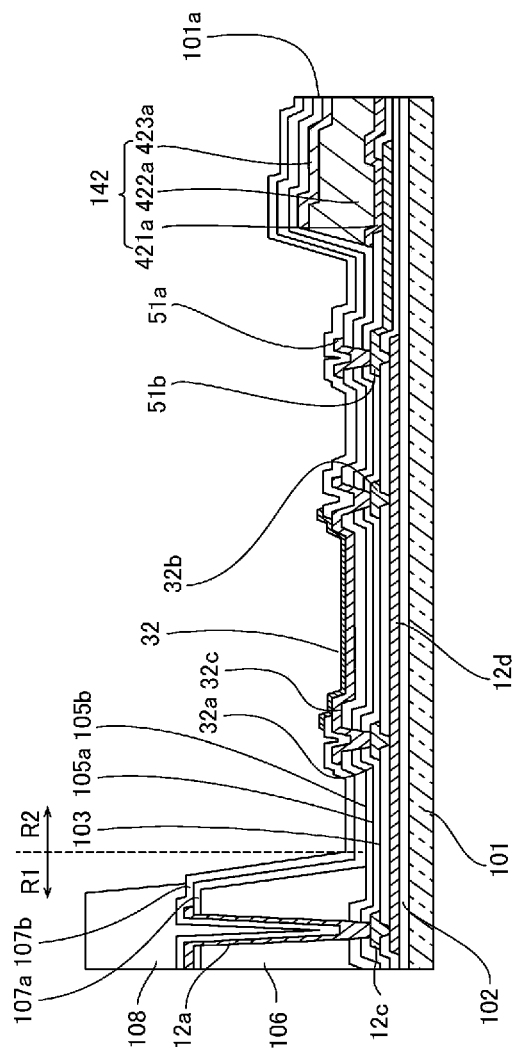
FIG. 6 is a cross-sectional view of the photoelectric conversion panel 1 taken along line A3-A4b in FIG. 3.

The configuration of the photoelectric conversion panel 1 will now be described in detail with reference to FIGS. 3 to 6. FIG. 3 is a plan view illustrating the configuration of a part of the photoelectric conversion panel 1. FIG. 4 is a cross-sectional view of the photoelectric conversion panel 1 taken along line A1-A2 in FIG. 3. FIG. 5 is a cross-sectional view of the photoelectric conversion panel 1 taken along line A3-A4a in FIG. 3. FIG. 6 is a cross-sectional view of the photoelectric conversion panel 1 taken along line A3-A4b in FIG. 3. As illustrated in FIG. 3, the TFTs 15 and the data terminals 32 are connected by the data lines 12. The photodiodes 141 and 142 are disposed between the data terminals 32 and the end surface 101a. The photodiodes 141 and 142 and the data terminals 32 are connected by the data lines 12. The data lines 12 each include a wiring line 12a, a connection electrode 12b, a connection electrode 12c, and a wiring line 12d. Note that the configuration of the photodiodes 141 and 142 connected with the gate lines 11 and the configuration of the photodiodes 141 and 142 connected with the bias line 13 illustrated in FIG. 2 are the same as the configuration of the photodiodes 141 and 142 connected with the data lines 12, and thus description thereof will be omitted.

Configuration Inside Pixel Region R1

As illustrated in FIG. 4, the TFT 15 includes the gate electrode 15a connected to the gate line 11 (see FIG. 2), a semiconductor active layer 15b, the source electrode 15c connected to the data line 12, and a drain electrode 15d connected to the photodiode 14. Also, the photodiode 14 includes a photoelectric conversion layer 16, a cathode 14b, and an anode 14c. The photoelectric conversion layer 16 is provided between the cathode 14b and the anode 14c. Also, the drain electrode 15d and the cathode 14b are connected via a cathode connection electrode 14a provided in a contact hole CH1.

A part of the connection electrode 12b is disposed in a contact hole CH2 and is connected to the wiring line 12a via the contact hole CH2. A part of the bias line 13 is formed inside a contact hole CH3.

Also, as illustrated in FIG. 4, the gate electrode 15a is formed above the substrate 101. The substrate 101 is a glass substrate with insulating properties, for example. The gate electrode 15a is formed as a layered film containing, for example, tungsten (W) and tantalum nitride (TaN) as materials. A gate insulating film 102 is formed covering the gate electrode 15a. The gate insulating film 102 has a layered configuration including, for example, an insulating film made of silicon oxide ($SiO_2$) as an upper layer and an insulating film made of silicon nitride ($SiN_x$) as a lower layer.

The semiconductor active layer 15b and the source electrode 15c and the drain electrode 15d connected to the semiconductor active layer 15b are formed above the gate electrode 15a with the gate insulating film 102 formed therebetween. The semiconductor active layer 15b includes an oxide semiconductor. The oxide semiconductor is an amorphous oxide semiconductor containing indium (In), gallium (Ga), and zinc (Zn) in a predetermined ratio, for example. With this configuration, the off-leak current of the TFT 15 can be reduced more than when amorphous silicon (a-Si) is used. When the off-leak current of the TFT 15 is small, a sensor panel with high sensitivity can be obtained, and the photoelectric conversion panel 1 with low exposure can be obtained. Note that the semiconductor active layer 15b is not limited to this configuration, and amorphous oxide semiconductors such as $InGaO_3(ZnO)_5$, magnesium zinc oxide ($Mg_xZn_{1-x}O$), cadmium zinc oxide ($Cd_xZn_{1-x}O$), cadmium oxide (CdO), InSnZno (containing indium (In), tin (Sn), and zinc (Zn)), and In(indium)-Al(aluminum)-Zn (zinc)-O(oxygen)-based amorphous oxide semiconductors may be used. "Amorphous" materials and "crystalline" materials (including polycrystalline, microcrystalline, and c-axis aligned materials) can also be used as the oxide semiconductor.

The source electrode 15c and the drain electrode 15d are disposed in contact with part of the semiconductor active layer 15b on the gate insulating film 102. The source electrode 15c and the drain electrode 15d are formed above the same layer. The source electrode 15c and the drain electrode 15d have a triple-layer structure layered including two metal films made of titanium (Ti) interposed by a metal film made of aluminum (Al), for example.

As illustrated in FIG. 4, a protection film 103 is provided covering the source electrode 15c and the drain electrode 15d above the gate insulating film 102. The protection film 103 is made of silicon oxide ($SiO_2$), for example. A flattening film 104 is provided in a layer above the protection film 103. In other words, the flattening film 104 levels an upper portion of the TFT 15. The flattening film 104 is formed of an organic insulating film containing a resin material (organic material).

The cathode connection electrode 14a is formed in a layer above the flattening film 104. The connection electrode 12b is formed in the same layer as the cathode connection electrode 14a, in a layer above the flattening film 104. The cathode connection electrode 14a is formed inside the contact hole CH1 and connects the drain electrode 15d and the cathode 14b. The connection electrode 12b is formed inside the contact hole CH2 and connects the source electrodes 15c and the wiring line 12a. The cathode connection electrode 14a and the connection electrode 12b have a triple-layer structure layered including two metal films made of titanium (Ti) interposed by a metal film made of aluminum (Al), for example. Here, the cathode connection electrode 14a and the connection electrode 12b contain aluminum, and since aluminum has a lower electrical resistance value than ITO, the cathode connection electrode 14a and the connection electrode 12b have low electrical resistance values.

An inorganic insulating film 105a is formed in a layer above the cathode connection electrode 14a and the connection electrode 12b. A contact hole CH4 is provided above the connection electrode 12b in the inorganic insulating film 105a, and a part of the wiring line 12a is provided inside the contact hole CH4. The inorganic insulating film 105a is made of silicon nitride ($SiN_x$) or silicon dioxide ($SiO_2$), for example.

The cathode 14b of the photodiode 14 is formed covering a part of the inorganic insulating film 105a in a layer above the cathode connection electrode 14a. Also, the cathode 14b and the cathode connection electrode 14a are in contact with one another. The cathode 14b is made of titanium (Ti), for example.

The photoelectric conversion layer 16 is formed in a layer above the cathode 14b. The photoelectric conversion layer 16 includes an n-type amorphous semiconductor layer 161, an intrinsic amorphous semiconductor layer 162, and a p-type amorphous semiconductor layer 163 sequentially layered. The n-type amorphous semiconductor layer 161 is made of amorphous silicon doped with n-type impurities (for example, phosphorus). The intrinsic amorphous semiconductor layer 162 is made of intrinsic amorphous silicon. The intrinsic amorphous semiconductor layer 162 is formed in contact with the n-type amorphous semiconductor layer 161. The p-type amorphous semiconductor layer 163 is made of amorphous silicon doped with p-type impurities (for example, boron). The p-type amorphous semiconductor layer 163 is formed in contact with the intrinsic amorphous semiconductor layer 162. The anode 14c is formed above the photoelectric conversion layer 16. For example, the anode 14c is made of indium tin oxide (ITO). Also, an inorganic insulating film 105c is formed covering the anode 14c. The contact hole CH3 where a part of the bias line 13 is provided is formed in the inorganic insulating film 105c. The inorganic insulating film 105c is made of silicon nitride ($SiN_x$) or silicon dioxide ($SiO_2$), for example.

An inorganic insulating film 105b is formed covering at least a part of the photodiode 14 and the inorganic insulating film 105a. Also, the inorganic insulating film 105b covers a part of the upper surface of the photodiode 14, and the side surface of the photodiode 14. The contact holes CH3 and CH4 are formed in the inorganic insulating film 105b. The inorganic insulating film 105b is formed as an inorganic insulating film made of silicon nitride ($SiN_x$), for example.

A flattening film 106 is formed in a layer above the photodiode 14 covering the inorganic insulating film 105b. Also, the flattening film 106 covers the photodiode 14 and levels a step portion formed by the photodiode 14. The flattening film 106 is made of the same material (organic insulating film) as the flattening film 104, for example. The contact holes CH3 and CH4 are formed in the flattening film 106.

An inorganic insulating film 107a is formed in a layer above the flattening film 106. The contact holes CH3 and CH4 are formed in the inorganic insulating film 107a. The wiring line 12a and the bias line 13 are formed in a layer above the inorganic insulating film 107a.

The wiring line 12a and the connection electrode 12b are connected inside the contact hole CH4. Also, the bias line 13 and the anode 14c of the photodiode 14 are connected inside the contact hole CH3. The wiring line 12a and the bias line 13 include a layer having a triple-layer structure layered including two metal films made of titanium (Ti) interposed by a metal film made of aluminum (Al), and a layer made of ITO.

An inorganic insulating film 107b is formed covering the inorganic insulating film 107a, the wiring line 12a, and the bias line 13. Also, the inorganic insulating films 107a and 107b are passivation films (protection films). The inorganic insulating films 107a and 107b are made of silicon nitride ($SiN_x$) or silicon dioxide ($SiO_2$), for example.

A flattening film 108 is formed covering the inorganic insulating film 107b. The flattening film 108 levels the portion above the wiring line 12a and the bias line 13. Also, the flattening film 108 is made of the same material (organic insulating film) as the flattening film 104, for example.

Configuration of Frame Region R2

As illustrated in FIG. 5, the wiring line 12a is connected to the wiring line 12d extending through the pixel region R1 and the frame region R2 via the connection electrode 12c. The connection electrode 12c is made of the same material as the cathode connection electrode 14a and the connection electrode 12b and is formed in the same layer. Also, the wiring line 12d is made of the same material (metal film) as the source electrode 15c and the drain electrode 15d and is formed in the same layer.

A terminal 32 is formed in a layer above the wiring line 12d. The terminal 32 is made of ITO, for example. Connection electrodes 32a, 32b, and 32c are provided between the terminal 32 and the wiring line 12d. The connection electrode 32a is disposed on the pixel region R1 side of the terminal 32. The connection electrode 32c is disposed on the end surface 101a side of the terminal 32. The connection electrode 32c is disposed straddled across the connection electrode 32a and the connection electrode 32b. The connection electrodes 32a and 32b are made of the same material as the cathode connection electrode 14a and the connection electrode 12c and are formed in the same layer. The connection electrode 32c is made of the same material as the wiring line 12a and is formed in the same layer.

Also, as illustrated in FIG. 5, the wiring line 12d is connected to a first wiring line 51a via a first wiring line 51b. The first wiring line 51b is made of the same material as the cathode connection electrode 14a and the connection electrode 12c and is formed in the same layer. The first wiring line 51a is made of the same material as the wiring line 12a and is formed in the same layer.

A part of the first wiring line 51a is disposed overlapping a part of the photodiode 141 in a plan view. The photodiode 141 includes an n-type amorphous semiconductor layer 411a, an intrinsic amorphous semiconductor layer 412a, a p-type amorphous semiconductor layer 413a, and an anode 41a sequentially layered. Here, the photodiode 141 is a part of a photodiode 41 described later remaining above the substrate 101. The n-type amorphous semiconductor layer 411a is made of the same material as the n-type amorphous semiconductor layer 161 and is formed in the same layer. The intrinsic amorphous semiconductor layer 412a is made of the same material as the intrinsic amorphous semiconductor layer 162 and is formed in the same layer. The p-type amorphous semiconductor layer 413a is made of the same material as the p-type amorphous semiconductor layer 163 and is formed in the same layer. The anode 41a is made of the same material as the anode 14c and is formed in the same layer. The anode 41a is connected to the first wiring line 51a with a part disposed in a contact hole CH11. Also, the n-type amorphous semiconductor layer 411a, the intrinsic amorphous semiconductor layer 412a, and the p-type amorphous semiconductor layer 413a are exposed at the end surface 101a. In the present embodiment, the anode 41a is not exposed at the end surface 101a. Also, the first wiring line 51a is not exposed at the end surface 101a. This allows the anode 41a and the first wiring line 51a to be protected from static electricity entering via the end surface 101a.

As illustrated in FIG. 6, the first wiring line 51b is connected to the photodiode 142. A part of the first wiring line 51b is disposed overlapping a part of the photodiode 142 in a plan view. The photodiode 142 includes an n-type amorphous semiconductor layer 421a, an intrinsic amorphous semiconductor layer 422a, and a p-type amorphous semiconductor layer 423a sequentially layered. The n-type amorphous semiconductor layer 421a is made of the same material as the n-type amorphous semiconductor layer 161 and is formed in the same layer. The intrinsic amorphous semiconductor layer 422a is made of the same material as the intrinsic amorphous semiconductor layer 162 and is formed in the same layer. The p-type amorphous semiconductor layer 423a is made of the same material as the p-type amorphous semiconductor layer 163 and is formed in the same layer. The n-type amorphous semiconductor layer 421a is connected to the first wiring line 51a. Also, the n-type amorphous semiconductor layer 421a, the intrinsic amorphous semiconductor layer 422a, and the p-type amorphous semiconductor layer 423a are exposed at the end surface 101a. Also, the first wiring line 51b is not exposed at the end surface 101a. This allows the first wiring line 51b to be protected from static electricity entering via the end surface 101a.

Manufacturing Method of Photoelectric Conversion Panel 1

Figure 7:
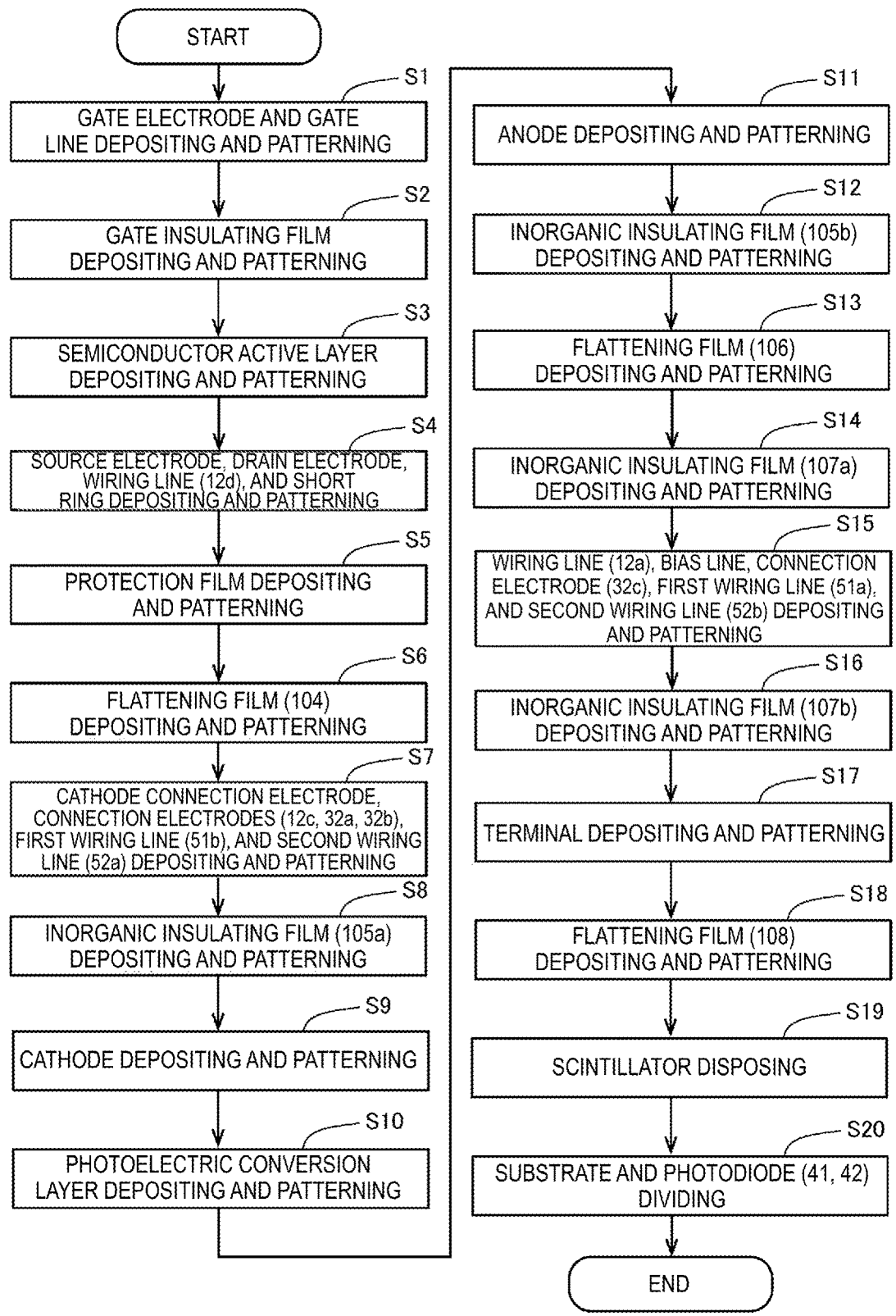
FIG. 7 is a flowchart for explaining a manufacturing process of the photoelectric conversion panel 1.
Figure 8:
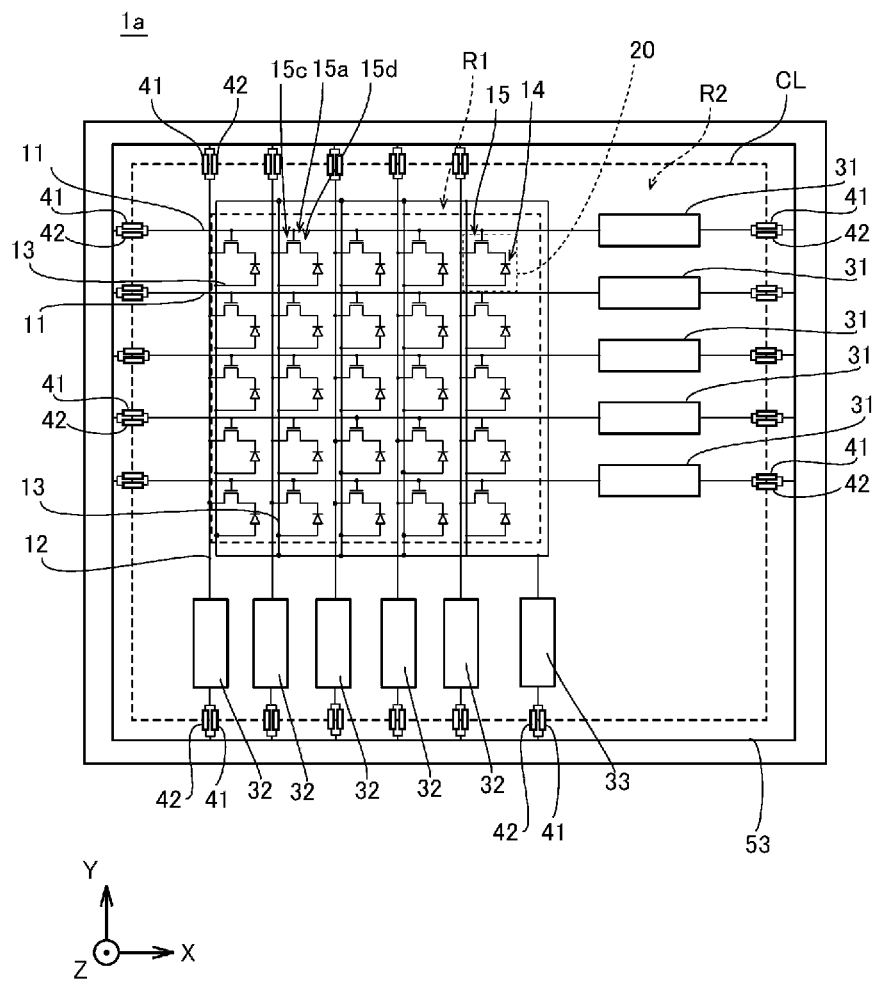
FIG. 8 is a schematic plan view for describing a photoelectric conversion panel 1a in a state before the process of dividing a substrate 101 (step S20).
Figure 9:
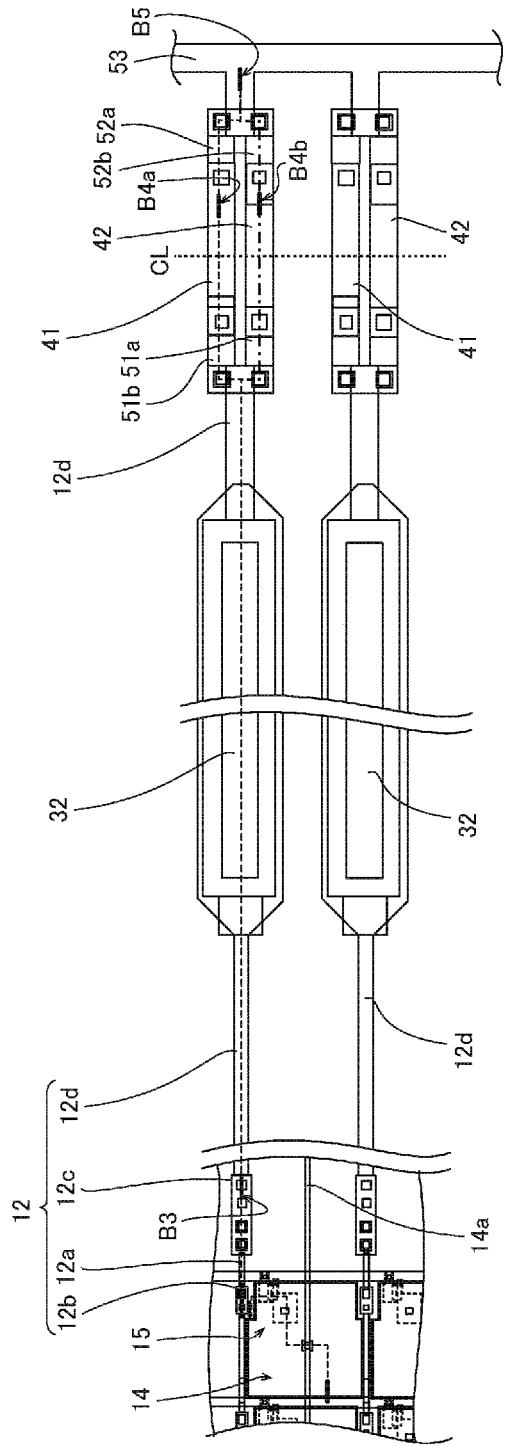
FIG. 9 is a plan view for describing the configuration of a part of the photoelectric conversion panel 1a before the process of dividing the substrate 101.
Figure 10:
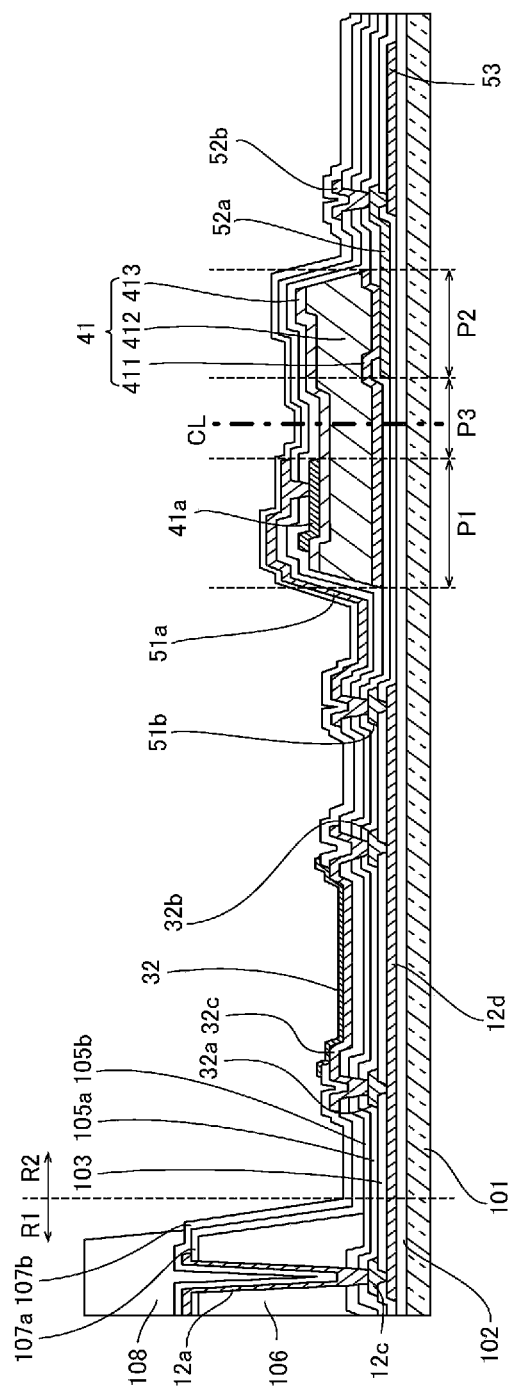
FIG. 10 is a cross-sectional view of the photoelectric conversion panel 1a taken along line B3-B4a-B5 in FIG. 9.
Figure 11:
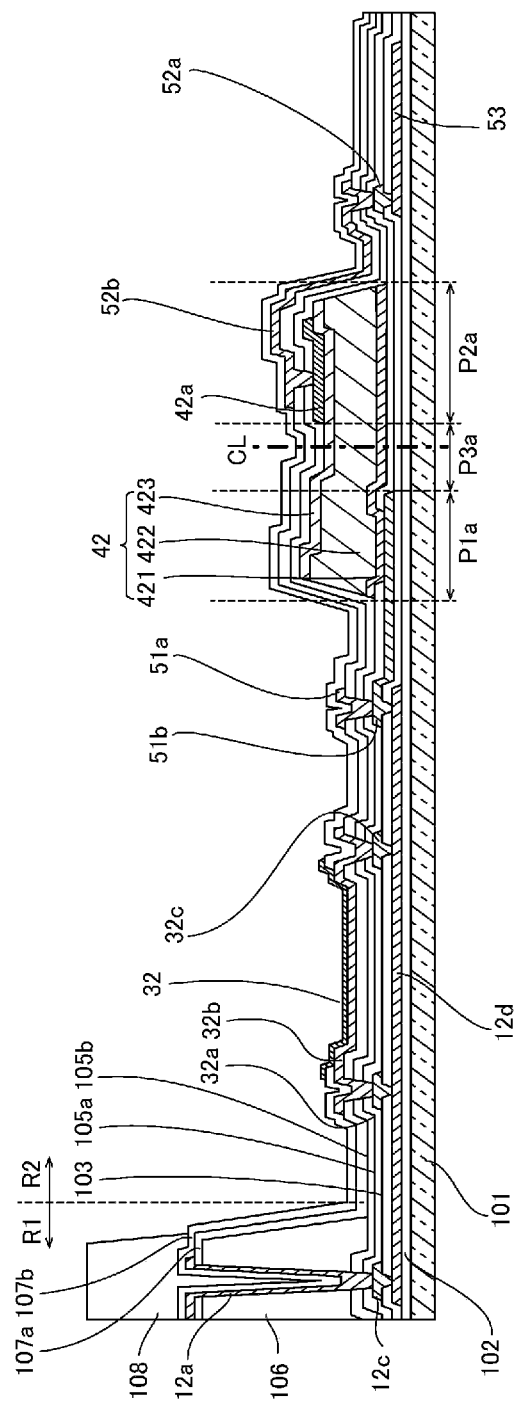
FIG. 11 is a cross-sectional view of the photoelectric conversion panel 1a taken along line B3-B4b-B5 in FIG. 9.

Next, a manufacturing method of the photoelectric conversion panel 1 according to the present embodiment will be described. FIG. 7 is a flowchart for explaining a manufacturing process of the photoelectric conversion panel 1. FIG. 8 is a schematic plan view for describing a photoelectric conversion panel 1a in a state before the process of dividing the substrate 101 (step S20). Note that the photoelectric conversion panel before the process of dividing the substrate 101 is referred to as the "photoelectric conversion panel 1a", and the photoelectric conversion panel after the process of dividing the substrate 101 is referred to as the "photoelectric conversion panel 1". FIG. 9 is a plan view for describing the configuration of a part of the photoelectric conversion panel 1a before the process of dividing the substrate 101. FIG. 10 is a cross-sectional view of the photoelectric conversion panel 1a taken along line B3-B4a-B5 in FIG. 9. FIG. 11 is a cross-sectional view of the photoelectric conversion panel 1a taken along line B3-B4b-B5 in FIG. 9.

Of the manufacturing method relating to the frame region R2 of the photoelectric conversion panel 1, the manufacturing method of the data lines 12, the data terminals 32, and the photodiodes 141 and 142 connected to the data lines 12 will be described below. Since the gate lines 11 and the bias line 13 in the frame region R2 has the same configuration as the data lines 12 in the frame region R2, description thereof will be omitted. Since the gate terminals 31 and the bias terminal 33 in the frame region R2 have the same configuration as the data terminals 32 in the frame region R2, description thereof will be omitted. Note that the photodiodes 141 and 142 connected to the gate lines 11 and the photodiodes 141 and 142 connected to the bias line 13 have the same configuration as the photodiodes 141 and 142 connected to the data lines 12, and thus description thereof will be omitted. Note that the photodiodes 141 and 142 in a state before the process of dividing the substrate 101 (step S20) are referred to as photodiodes 41 and 42.

As illustrated in FIG. 7, in step S1, in the pixel region R1, the gate electrodes 15a (see FIG. 4) are deposited on the substrate 101 and patterned. Also, in this step S1, as illustrated in FIG. 8, in the frame region R2, the gate lines 11 are deposited on the substrate 101 and patterned.

In step S2, the gate insulating film 102 is deposited covering the gate electrodes 15a and the gate lines 11 and patterned. In step S3, in the pixel region R1, the semiconductor active layer 15b (see FIG. 4) is deposited on the gate insulating film 102 and patterned.

In step S4, in the pixel region R1, the source electrode 15c and the drain electrode 15d are deposited on the gate insulating film 102 and patterned. In this manner, the TFT 15 is formed. Also, in step S4, as illustrated in FIGS. 10 and 11, in the frame region R2, the wiring line 12d, which is a part of the data line 12, and a short ring 53 are formed on the gate insulating film 102. The short ring 53 is made of the same material as the source electrode 15c and the drain electrode 15d, for example.

As illustrated in FIG. 8, the short ring 53 is disposed on the outer side of a cutting line CL of the substrate 101 in a plan view. The short ring 53 is connected to the plurality of gate terminals 31, the plurality of data terminals 32, and the bias terminal 33 via the photodiodes 41 and 42. The short ring 53 is formed in a rectangular frame-like shape in a plan view. Also, in the manufacturing process of the photoelectric conversion panel 1, in the time period before the process of dividing the substrate 101 (step S20), the plurality of gate terminals 31, the plurality of data terminals 32, and the bias terminal 33 are short-circuited by the short ring 53. Accordingly, even when the photodiodes 14 or the TFTs 15 inside the pixel region R1 accumulate charge, static electricity can be dissipated to other portions, preventing static electricity damage.

In step S5, as illustrated in FIG. 4, in the pixel region R1, the protection film 103 is deposited on the gate insulating film 102 covering the source electrode 15c and the drain electrode 15d and patterned. Also, as illustrated in FIGS. 10 and 11, in the frame region R2, the protection film 103 is deposited on the gate insulating film 102 covering the wiring line 12d and patterned.

In step S6, as illustrated in FIG. 4, in the pixel region R1, the flattening film 104 is deposited on the protection film 103.

In the step S7, the cathode connection electrode 14a and the connection electrode 12b are formed in the pixel region R1. Also, in step S7, in the frame region R2, the connection electrodes 12c, 32a, and 32b, the first wiring line 51b, and a second wiring line 52a are formed.

As illustrated in FIG. 9, the second wiring line 52a connects the photodiode 41 and the short ring 53 on the outer side of the cutting line CL of the photoelectric conversion panel 1a. The second wiring line 52a is made of the same material as the cathode connection electrode 14a, for example.

In step S8, the inorganic insulating film 105a is deposited and patterned. Then, in step S9, in the pixel region R1, the cathode 14b (see FIG. 4) of the photodiode 14 is deposited on a part of the inorganic insulating film 105a and the cathode connection electrode 14a and patterned.

In step S10, in the pixel region R1, the photoelectric conversion layer 16 (see FIG. 4) is deposited. Specifically, the n-type amorphous semiconductor layer 161, the intrinsic amorphous semiconductor layer 162, and the p-type amorphous semiconductor layer 163 are sequentially layered. Also, as illustrated in FIG. 10, in step S10, in the frame region R2, an n-type amorphous semiconductor layer 411, an intrinsic amorphous semiconductor layer 412, and a p-type amorphous semiconductor layer 413 are sequentially layered overlapping the second wiring line 52a in a plan view. Also, as illustrated in FIG. 11, in step S10, in the frame region R2, an n-type amorphous semiconductor layer 421, an intrinsic amorphous semiconductor layer 422, and a p-type amorphous semiconductor layer 423 are sequentially layered overlapping the first wiring line 51b in a plan view.

In step S11, in the pixel region R1, the anode 14c is deposited in a layer above the p-type amorphous semiconductor layer 163. Also, in step S11, in the frame region R2, the anode 41a is deposited in a region not overlapping the second wiring line 52a covering a part of the p-type amorphous semiconductor layer 413. Also, in step S11, in the frame region R2, an anode 42a is deposited in a region not overlapping the first wiring line 51b covering a part of the p-type amorphous semiconductor layer 413.

In step S12, the inorganic insulating film 105b is deposited and patterned. In step S13, the flattening film 106 is formed in the pixel region R1 as illustrated in FIG. 4. In step S14, the inorganic insulating film 107a is deposited and patterned. In step S15, the wiring line 12a of the data line 12, the bias line 13, the first wiring line 51a, a second wiring line 52b, and the connection electrode 32c are deposited and patterned. As illustrated in FIG. 9, the first wiring lines 51a and the data lines 12 are wiring lines that connect the photodiodes 41 and the TFTs 15. Also, the first wiring lines 51b and the data lines 12 are wiring lines that connect the photodiodes 42 and the TFTs 15. Furthermore, the second wiring line 52b connects the photodiode 42 and the short ring 53 on the outer side of the cutting line CL of the photoelectric conversion panel 1a. The second wiring line 52b is made of the same material as the wiring line 12a of the data line 12 and the bias line 13, for example.

By performing the manufacturing process up to step S15, in the frame region R2, the photodiode 41 is completed straddling the cutting line CL. In the frame region R2, the photodiode 42 connected in anti-parallel to the photodiode 41 is completed. Also, the photodiode 42 is formed straddling the cutting line CL. Accordingly, via the photodiodes 41 and 42, a current can flow from the data lines 12 to the short ring 53, and a current can flow from the short ring 53 to the data lines 12. In this manner, when the photoelectric conversion panel 1a is positively charged or when the photoelectric conversion panel 1a is negatively charged, the charge can be discharged to the short ring 53 via the photodiodes 41 and 42.

As illustrated in FIG. 10, the portion of the photodiode 41 that overlaps the first wiring line 51a in a plan view corresponds to a portion P1, and the portion of the photodiode 41 that overlaps the second wiring line 52a in a plan view corresponds to a portion P2. Also, the portion between the portion P1 and the portion P2 corresponds to a portion P3. The portion P3 does not overlap the first wiring line 51a, the second wiring line 52a, or the anode 41a in a plan view.

As illustrated in FIG. 11, the portion of the photodiode 42 that overlaps the first wiring line 51b in a plan view corresponds to a portion P1a, and the portion of the photodiode 42 that overlaps the second wiring line 52b in a plan view corresponds to a portion P2a. Also, the portion between the portion P1a and the portion P2a corresponds to a portion P3a. The portion P3a does not overlap the first wiring line 51b, the second wiring line 52b, or the anode 42a in a plan view. Also, as illustrated in FIG. 9, the photodiode 41 and the photodiode 42 are formed in contact with one another in the extending direction of the cutting line CL in a plan view.

Then, in step S16, the inorganic insulating film 107b is deposited on the flattening film 106 covering the wiring line 12a, the bias line 13, the first wiring line 51a, and the second wiring line 52b and patterned so as to expose the connection electrode 32c. In step S17, the data terminals 32 are deposited and patterned. Then, in step S18, the flattening film 108 is deposited covering the inorganic insulating film 107b and patterned.

In step S19, the scintillator 2 is disposed covering the pixel region R1. In step S20, the substrate 101 is divided along the cutting line CL. As illustrated in FIGS. 10 and 11, the cutting line CL is provided on the portion P3 of the photodiode 41 and the portion P3a of the photodiode 42. In other words, the photodiode 41 is divided at the portion P3 of the photodiode 41 so as to divide the portion P1 and the portion P2 of the photodiode 41. Also, the photodiode 42 is divided at the portion P3a of the photodiode 42 so as to divide the portion P1a and the portion P2a of the photodiode 42. Thus, as illustrated in FIG. 5, only the portion P1 and a part of the portion P3 of the photodiode 41 remain. Here, the n-type amorphous semiconductor layer 411, the intrinsic amorphous semiconductor layer 412, and the p-type amorphous semiconductor layer 413 are in this state exposed at the end surface 101a of the substrate 101, but the first wiring line 51a is not exposed from the end surface 101a. Also, as illustrated in FIG. 6, only the portion P1a and a part of the portion P3a of the photodiode 42 remain. Here, the n-type amorphous semiconductor layer 421, the intrinsic amorphous semiconductor layer 422, and the p-type amorphous semiconductor layer 423 are in this state exposed at the end surface 101a of the substrate 101, but the first wiring line 51b is not exposed from the end surface 101a.

In this manner, the photoelectric conversion panel 1 (X-ray imaging panel 10) is completed. According to the above-described manufacturing method, the first wiring lines 51a and 51b and the second wiring lines 52a and 52b are not exposed at the end surface 101a (cutting surface) of the photoelectric conversion panel 1. As a result, the photoelectric conversion panel 1 (X-ray imaging panel 10) resistant to static electricity from the end surfaces 101a even after the substrate 101 is divided can be manufactured.

Also, according to the above-described manufacturing method, the photodiodes 41 and 42 are formed of the same material as the photodiode 14 in the forming process of the photodiode 14. Thus, the photodiode 14 and the photodiodes 41 and 42 can be formed in the same process, reducing the number of processes involved in manufacturing the photoelectric conversion panel 1.

Also, according to the above-described manufacturing method, in step S20 (one process), the photodiodes 41 and 42 are divided. This reduces the number of processes involved in manufacturing the photoelectric conversion panel 1 compared to a method in which the photodiodes 41 and 42 are divided in different processes.

According to the above-described manufacturing method, the portion P3 does not overlap the anode 41a in a plan view. Also, the portion P3a does not overlap the anode 42a in a plan view. Accordingly, the anode 41a and the anode 42a are not exposed at the end surface 101a. As a result, the photoelectric conversion panel 1 more resistant to static electricity from the end surfaces 101a can be manufactured.

Also, according to the above-described manufacturing method, the photodiodes 41 and 42 are formed on the opposite side of the data terminals 32 to the pixel region R1. Accordingly, a part of the data line 12 can be used as a wiring line connecting the photodiode 41, 42 to the TFT 15.

Modified Examples

Embodiments have been described above, but the embodiments described above are merely examples for implementing the disclosure. Thus, the disclosure is not limited to the embodiments described above and can be implemented by modifying the embodiments described above as appropriate without departing from the scope of the disclosure.

(1) In the above-described embodiment, the anodes 41a and 42a of the photodiodes 41 and 42 are not exposed at the end surfaces 101a, but the disclosure is not limited thereto. For example, in a photoelectric conversion panel 201 according to a modified example illustrated in FIGS. 12 and 13, an anode 241a may be exposed at a cutting surface 201a. In this case, the anode 241a is formed of a member with electrical conductivity that does not include a metal material. For example, the anode 241a is made of ITO.

Figure 12:
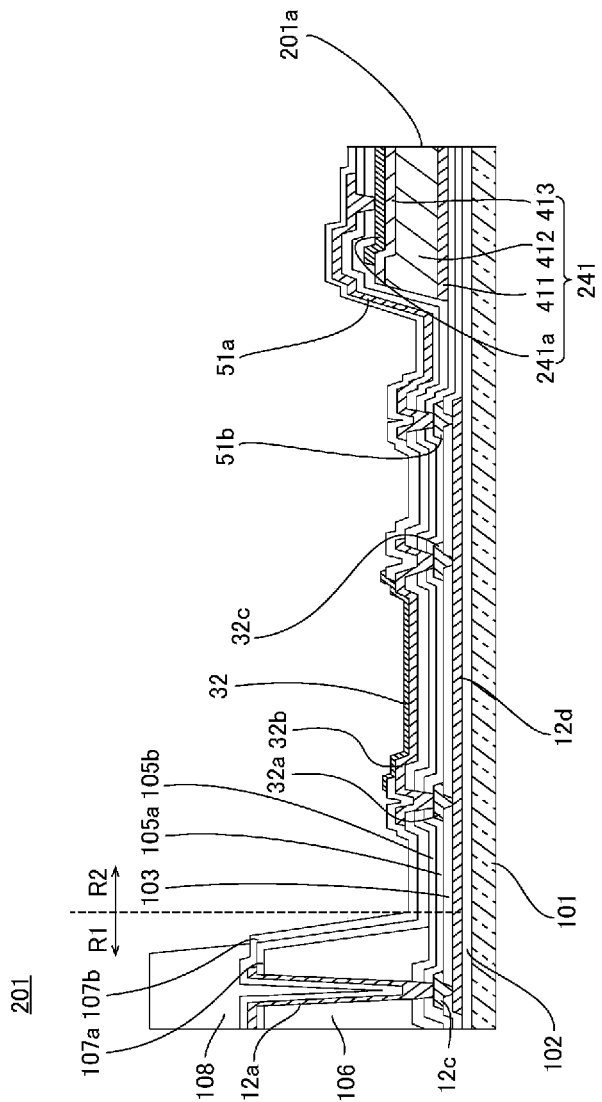
FIG. 12 is a cross-sectional view of a part of a photoelectric conversion panel 201 according to a modified example.
Figure 13:
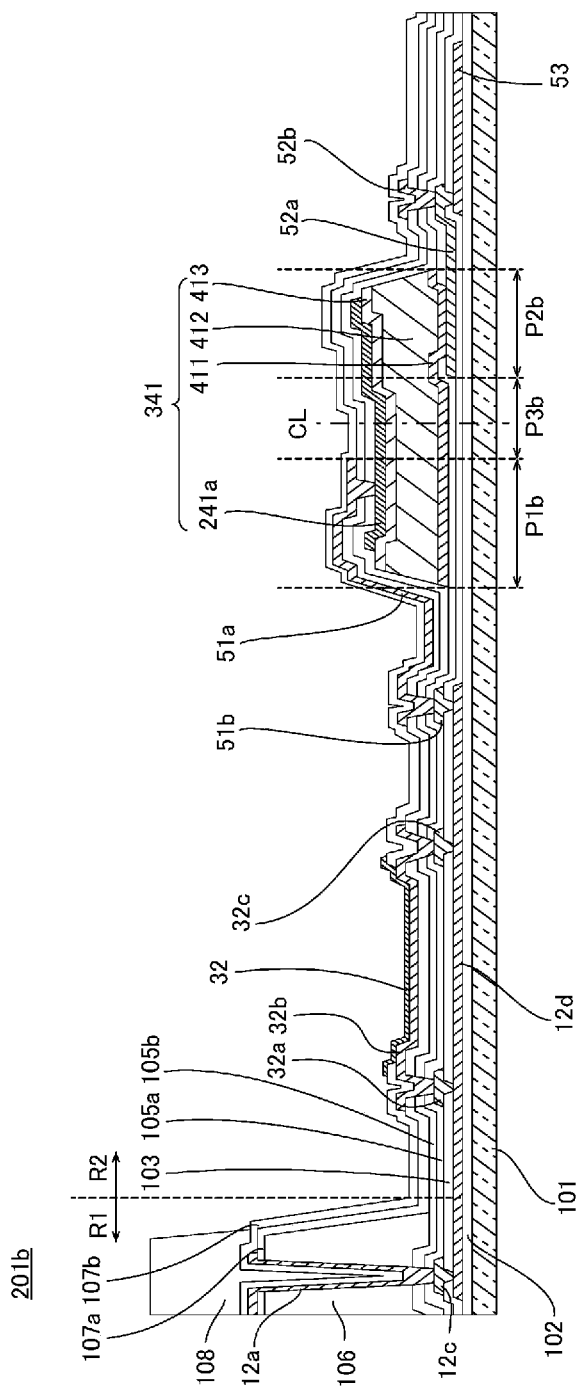
FIG. 13 is a cross-sectional view of a part of a photoelectric conversion panel 201b according to a modified example.

FIG. 12 is a cross-sectional view of a part of the photoelectric conversion panel 201 according to a modified example. FIG. 13 is a cross-sectional view of a part of a photoelectric conversion panel 201b according to the modified example. Note that the same configurations as those of the embodiment will be denoted by the same reference signs as those of the embodiment, and descriptions thereof will be omitted. Also, the photoelectric conversion panel in a completed state is referred to as the photoelectric conversion panel 201, and the photoelectric conversion panel before the process (step S20) of dividing the substrate 101 during the manufacturing is referred to as the photoelectric conversion panel 201*b*. Also, the photodiode after division is referred to as a photodiode 241, and the photodiode before division is referred to as a photodiode 341.

As illustrated in FIG. 13, the photoelectric conversion panel 201*b* according to the modified example is provided with the photodiode 341. The anode 241*a* of the photodiode 341 is formed in portions P1*b*, P2*b*, and P3*b*. Also, since the substrate 101 and the photodiode 341 are divided, as illustrated in FIG. 12, the anode 241*a* of the photodiode 241 is exposed at the cutting surface 201*a*. The anode 241*a* is made of ITO which has greater electrical resistance than a metal material, allowing static electricity to be prevented from entering from the cutting surface 201*a*.

(2) In the above-described embodiment, the process (step S20) of dividing the substrate 101 and the photodiodes 41 and 42 is performed after the process (step S19) of disposing the scintillator 2, but the disclosure is not limited thereto. In other words, the step of disposing the scintillator may be performed after the step of dividing.

(3) In the above-described embodiment, the photodiode 141 and the photodiode 142 connected in anti-parallel to the photodiode 141 are provided in the photoelectric conversion panel 1*a*, but the disclosure is not limited thereto. For example, in a case in which the polarity of the charge that occurs during the manufacture of the photoelectric conversion panel 1*a* is determined, only the photodiode 141 or only the photodiode 142 may be disposed.

(4) In the above-described embodiment, as illustrated in FIG. 8, the photodiodes 141 and 142 are provided in the plurality of gate lines 11, the plurality of data lines 12, and the bias line 13, but the disclosure is not limited thereto. For example, the photodiodes 141 and 142 may be provided in only one of more wiring lines from among the plurality of gate lines 11, the plurality of data lines 12, and the bias line 13.

(5) In the above-described embodiment, the photodiodes 141 and 142 are formed in the same process as the photodiodes 14, but the disclosure is not limited thereto. For example, the photodiodes 141 and 142 may be formed in a process before or after the photodiodes 14.

(6) In the above-described embodiment, the photodiodes 141 and 142 are divided in the same process, but the disclosure is not limited thereto. For example, the photodiodes 141 and 142 may be divided in different processes.

(7) In the above-described first to third embodiments, examples of the materials of the layers (films) forming the photoelectric conversion panel are given, but the disclosure is not limited to these examples. In other words, the layers (films) forming the photoelectric conversion panel may be made of materials not used in the examples described above.

The manufacturing method of a photoelectric conversion panel and the manufacturing method of an X-ray imaging panel described above can also be described as follows.

A manufacturing method of a photoelectric conversion panel according to a first configuration includes: forming a transistor in a pixel region above a substrate; forming a first photodiode connected to the transistor in the pixel region; forming a second photodiode in a region outside the pixel region; forming a first wiring line overlapping a first portion of the second photodiode in a plan view, the first wiring line connecting the transistor or the first photodiode and the second photodiode; forming a second wiring line not overlapping the first portion of the second photodiode in a plan view and overlapping a second portion of the second photodiode in a plan view; and dividing the second photodiode and the substrate at a third portion between the first portion of the second photodiode and the second portion of the second photodiode, the third portion not overlapping the first wiring line and the second wiring line in a plan view (first configuration).

According to the above-described first configuration, the first wiring line and the second wiring line are not exposed at the cutting surface of the photoelectric conversion panel. As a result, a photoelectric conversion panel resistant to static electricity from the cutting surface even after the substrate is divided can be manufactured. Here, in the case of a configuration in which a photodiode is not provided and the first wiring line and the second wiring line are formed of semiconductors straddling the cutting section, the metal wiring line is exposed at the cutting surface, but due to a semiconductor being used, the static electricity tolerability is greater than in a case in which a wiring line with electrical conductivity is divided. However, even with a semiconductor wiring line with high resistance, a current still flows, thus making it insufficient for this purpose. On the other hand, according to the first configuration, during the manufacture of a photoelectric conversion panel, a charge accumulated at the photoelectric conversion panel can be discharged via the photodiode before division, and after manufacturing the photoelectric conversion panel (after dividing the substrate), a photoelectric conversion panel resistant to static electricity from the cutting surface can be obtained.

In the first configuration, the forming the second photodiode may include forming the second photodiode when the first photodiode is formed using an identical material to the first photodiode (second configuration).

According to the above-described second configuration, the first photodiode and the second photodiode can be formed in the same process, reducing the number of processes involved in manufacturing the photoelectric conversion panel.

In the first or second configurations, the manufacturing method of a photoelectric conversion panel may further include forming a third photodiode connected in anti-parallel to the second photodiode, the third photodiode including a fourth portion overlapping the first wiring line in a plan view, a fifth portion overlapping the second wiring line in a plan view, and a sixth portion not overlapping the first wiring line and the second wiring line in a plan view. The dividing may include dividing the third photodiode and the substrate at the sixth portion of the third photodiode (third configuration).

According to the above-described third configuration, the second photodiode and the third photodiode allow a current to flow from the first wiring line to the second wiring line and from the second wiring line to the first wiring line. In this manner, when the photoelectric conversion panel is positively charged or when the photoelectric conversion panel is negatively charged, the charge can be discharged to the second wiring line via the second photodiode and the third photodiode.

In the third configuration, the forming the third photodiode may include forming the third photodiode adjacent to the second photodiode. The dividing may include simultaneously dividing the second photodiode and the third photodiode (fourth configuration).

According to the above-described fourth configuration, the second photodiode and the third photodiode can be divided in a single process, reducing the number of processes involved in manufacturing the photoelectric conversion panel.

In any one of the first to fourth configurations, the forming the second photodiode may include forming an electrode not overlapping the third portion in a plan view and overlapping the first portion in a plan view, the electrode connecting the first wiring line and the second photodiode (fifth configuration).

According to the above-described fifth configuration, even in a case in which an electrode is provided between the first wiring line and the second photodiode, the electrode is not exposed at the cutting surface. As a result, even when an electrode is provided between the first wiring line and the second photodiode, a photoelectric conversion panel resistant to static electricity from the cutting surface can be manufactured.

In any one of the first to fifth configurations, the manufacturing method of a photoelectric conversion panel may further include forming a terminal connected to the first wiring line in the region outside the pixel region. The forming the second photodiode may include forming the second photodiode on an opposite side of the terminal to the pixel region (sixth configuration).

According to the above-described sixth configuration, a part of the wiring line connecting the transistor or the first photodiode and the terminal can be used as the first wiring line.

A manufacturing method of an X-ray imaging panel according to a seventh configuration includes: forming a transistor in a pixel region above a substrate; forming a first photodiode connected to the transistor in the pixel region; forming a second photodiode in a region outside the pixel region; forming a first wiring line overlapping a first portion of the second photodiode in a plan view, the first wiring line connecting the transistor or the first photodiode and the second photodiode; forming a second wiring line not overlapping the first portion of the second photodiode in a plan view and overlapping a second portion of the second photodiode in a plan view; forming a scintillator covering the pixel region; and dividing the second photodiode and the substrate at a third portion between the first portion of the second photodiode and the second portion of the second photodiode, the third portion not overlapping the first wiring line and the second wiring line in a plan view (seventh configuration).

According to the above-described seventh configuration, the first wiring line and the second wiring line are not exposed at the cutting surface of the X-ray imaging panel. As a result, an X-ray imaging panel resistant to static electricity from the cutting surface even after the substrate is divided can be manufactured.

A photoelectric conversion panel according to an eighth configuration includes: a substrate; a transistor formed in a pixel region above the substrate; a photodiode formed in the pixel region, the photodiode being connected to the transistor; a semiconductor layer formed in a region outside the pixel region, the semiconductor layer being formed in an identical layer to a layer including the photodiode; and a first wiring line overlapping a first portion of the semiconductor layer in a plan view, the first wiring line connecting the transistor or the photodiode and the semiconductor layer, wherein a portion of the semiconductor layer not overlapping the first wiring line in a plan view is exposed at an end surface of the substrate (eighth configuration).

Also, according to the eighth configuration, the first wiring line is not exposed at the cutting surface (end surface) of the photoelectric conversion panel (substrate). Accordingly, a photoelectric conversion panel resistant to static electricity from the cutting surface can be configured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A manufacturing method for a photoelectric conversion panel, the manufacturing method comprising:
   forming a transistor in a pixel region above a substrate;
   forming a first photodiode connected to the transistor in the pixel region;
   forming a second photodiode in a region outside the pixel region;
   forming a first wiring line overlapping a first portion of the second photodiode in a plan view, the first wiring line connecting the transistor or the first photodiode to the second photodiode;
   forming a second wiring line not overlapping the first portion of the second photodiode in the plan view and overlapping a second portion of the second photodiode in the plan view; and
   dividing the second photodiode and the substrate at a third portion between the first portion of the second photodiode and the second portion of the second photodiode, the third portion not overlapping the first wiring line and the second wiring line in the plan view.

2. The manufacturing method of claim 1,
   wherein forming the second photodiode comprises forming the second photodiode when the first photodiode is formed using an identical material to the second photodiode.

3. The manufacturing method of claim 1, further comprising:
   forming a third photodiode connected in anti-parallel to the second photodiode, the third photodiode including a fourth portion overlapping the first wiring line in the plan view, a fifth portion overlapping the second wiring line in the plan view, and a sixth portion not overlapping the first wiring line and the second wiring line in the plan view,
   wherein dividing the second photodiode and the substrate further comprises dividing the third photodiode and the substrate at the sixth portion of the third photodiode.

4. The manufacturing method of claim 3,
   wherein forming the third photodiode comprises forming the third photodiode adjacent to the second photodiode, and
   dividing the second photodiode and the substrate further comprises simultaneously dividing the second photodiode and the third photodiode.

5. The manufacturing method of claim 1,
   wherein forming the second photodiode comprises forming an electrode not overlapping the third portion in the plan view and overlapping the first portion in the plan view, the electrode connecting the first wiring line and the second photodiode.

6. The manufacturing method of claim 1, further comprising:
   forming a terminal connected to the first wiring line in the region outside the pixel region,
   wherein forming the second photodiode comprises forming the second photodiode on a side of the terminal opposite the pixel region.

7. A manufacturing method of an X-ray imaging panel comprising:

forming a transistor in a pixel region above a substrate;

forming a first photodiode connected to the transistor in the pixel region;

forming a second photodiode in a region outside the pixel region;

forming a first wiring line overlapping a first portion of the second photodiode in the plan view, the first wiring line connecting the transistor or the first photodiode to the second photodiode;

forming a second wiring line not overlapping the first portion of the second photodiode in the plan view and overlapping a second portion of the second photodiode in the plan view;

forming a scintillator covering the pixel region; and dividing the second photodiode and the substrate at a third portion between the first portion of the second photodiode and the second portion of the second photodiode, the third portion not overlapping the first wiring line and the second wiring line in the plan view.

* * * * *